United States Patent
Cho et al.

(10) Patent No.: US 12,532,447 B2
(45) Date of Patent: Jan. 20, 2026

(54) METHODS OF FABRICATING A CAPACITOR AND SEMICONDUCTOR DEVICE

(71) Applicant: SAMSUNG ELECTRONICS CO., LTD., Suwon-si (KR)

(72) Inventors: Cheoljin Cho, Hwaseong-si (KR); Hyunjun Kim, Gwacheon-si (KR); Yukyung Shin, Suwon-si (KR); Jongbeom Seo, Seoul (KR); Changhwa Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 591 days.

(21) Appl. No.: 17/954,482

(22) Filed: Sep. 28, 2022

(65) Prior Publication Data
US 2023/0107346 A1    Apr. 6, 2023

(30) Foreign Application Priority Data
Oct. 1, 2021    (KR) .................. 10-2021-0131139

(51) Int. Cl.
*H10B 12/00*    (2023.01)
*H10D 1/00*    (2025.01)

(52) U.S. Cl.
CPC ............ *H10B 12/03* (2023.02); *H10D 1/041* (2025.01); *H10D 1/042* (2025.01)

(58) Field of Classification Search
CPC ...... H10B 12/03; H10B 12/033; H10D 1/041; H10D 1/042
See application file for complete search history.

(56) References Cited

U.S. PATENT DOCUMENTS

| | | | |
|---|---|---|---|
| 7,396,719 B2 | 7/2008 | Kim et al. | |
| 7,425,761 B2 | 9/2008 | Choi et al. | |
| 8,012,823 B2 | 9/2011 | Lim et al. | |
| 8,586,430 B2 | 11/2013 | Komeda | |
| 2002/0022334 A1* | 2/2002 | Yang | H10D 1/684 257/E21.01 |

(Continued)

FOREIGN PATENT DOCUMENTS

| | | |
|---|---|---|
| KR | 10-0706823 | 4/2007 |
| KR | 10-2008-0032599 A | 4/2008 |
| KR | 10-2010-0006899 A | 1/2010 |

OTHER PUBLICATIONS

Office Action dated May 28, 2025 issued in corresponding Korean Patent Application No. 10-2021-0131139.

*Primary Examiner* — Zandra V Smith
*Assistant Examiner* — Molly K Reida
(74) *Attorney, Agent, or Firm* — Morgan, Lewis & Bockius LLP

(57) ABSTRACT

A method of fabricating a capacitor includes forming a lower electrode on a semiconductor substrate in a reaction space. A homogeneous oxide layer is formed on the lower electrode. A dielectric layer is formed on the homogeneous oxide layer. An upper electrode is formed on the dielectric layer. The forming of the homogeneous oxide layer includes performing a homogeneous oxide layer forming cycle at least one time. The homogeneous oxide layer forming cycle includes supplying an oxidizing agent, purging the oxidizing agent, and pumping-out the reaction space.

20 Claims, 16 Drawing Sheets

(56) References Cited

U.S. PATENT DOCUMENTS

| | | | |
|---|---|---|---|
| 2006/0046380 A1* | 3/2006 | Choi | H10B 12/033 |
| | | | 438/238 |
| 2007/0099379 A1* | 5/2007 | Choi | H01L 21/0228 |
| | | | 438/257 |
| 2010/0009508 A1* | 1/2010 | Lim | H01L 21/31641 |
| | | | 438/381 |
| 2011/0222207 A1 | 9/2011 | Lee et al. | |
| 2013/0171797 A1 | 7/2013 | Park et al. | |
| 2021/0118982 A1* | 4/2021 | Song | H01L 21/28562 |

* cited by examiner

METHODS OF FABRICATING A CAPACITOR AND SEMICONDUCTOR DEVICE

CROSS-REFERENCE TO RELATED APPLICATION

This application claims priority under 35 U.S.C. § 119 to Korean Patent Application No. 10-2021-0131139, filed on Oct. 1, 2021 in the Korean Intellectual Property Office, the disclosure of which is incorporated by reference in its entirety herein.

1. TECHNICAL FIELD

The present inventive concept relates to a method of fabricating capacitors and a method of fabricating semiconductor devices, and more particularly, to methods of fabricating capacitors and semiconductor devices with increased device reliability and having reduced 2-bit type defects.

2. DISCUSSION OF RELATED ART

There is a demand for miniaturization and high performance of semiconductor devices. Capacitors applied to dynamic random access memory (DRAM) may exhibit collapse defects which decrease the stability and reliability of the semiconductor devices.

SUMMARY

Embodiments of the present inventive concept provides a method of fabricating capacitor with increased device reliability and having reduced 2-bit type defects.

Embodiments of the present inventive concept provides a method of fabricating a semiconductor device with increased device reliability and having reduced 2-bit type detects.

According to an embodiment of the present inventive concept, a method of fabricating a capacitor includes forming a lower electrode on a semiconductor substrate in a reaction space. A homogeneous oxide layer is formed on the lower electrode. A dielectric layer is formed on the homogeneous oxide layer. An upper electrode is formed on the dielectric layer. The forming of the homogeneous oxide layer includes performing a homogeneous oxide layer forming cycle at least one time. The homogeneous oxide layer forming cycle includes supplying an oxidizing agent, purging the oxidizing agent, and pumping-out the reaction space.

According to an embodiment of the present inventive concept, a method of fabricating a semiconductor device includes forming a lower electrode on a semiconductor substrate in a reaction space. A homogeneous oxide layer forming cycle is performed at least two times to form a homogeneous oxide layer on the lower electrode. An interface layer is formed on the homogeneous oxide layer after the performing of the homogeneous oxide layer forming cycle at least two times. A dielectric layer is formed on the interface layer. An upper electrode is formed on the dielectric layer. The homogeneous oxide layer forming cycle includes sequentially performing: supplying an oxidizing agent; purging the oxidizing agent; and pumping-out the reaction space. The forming of the dielectric layer on the interface layer includes performing a deposition cycle at least two times. The deposition cycle includes providing a metal precursor on the interface layer, purging the excess metal precursor, supplying a reactant to form the dielectric layer and purging excess reactant.

According to an embodiment of the present inventive concept, a method of fabricating a semiconductor device includes forming a conductive lower electrode on a semiconductor substrate. The conductive lower electrode includes a nitride of a metal A. A homogeneous oxide layer is formed on the lower electrode. A dielectric layer is formed on the homogeneous oxide layer. An upper electrode is formed on the dielectric layer. The forming of the homogeneous oxide layer includes performing a homogeneous oxide layer forming cycle at least one time. The homogeneous oxide layer forming cycle includes sequentially performing: partially converting the nitride of the metal A into an oxide of the metal A by supplying an oxidizing agent; purging the oxidizing agent; and reducing a pressure around the lower electrode to about 1 Pa to about 30 Pa.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
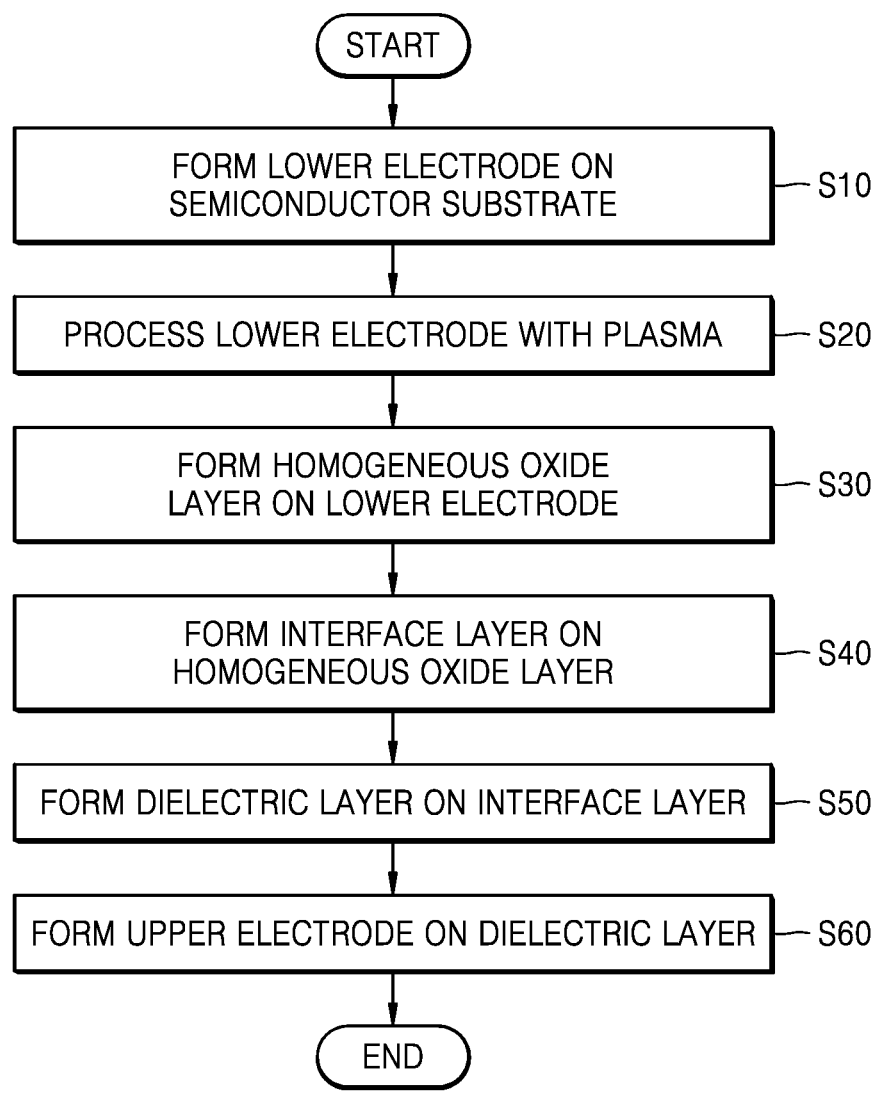
FIG. 1 is a flowchart illustrating a method of fabricating a capacitor according to an embodiment of the present inventive concept.

Hereinafter, embodiments of the present inventive concept are described in detail with reference to the accompanying drawings. The same reference numerals are given to the same components in the drawings, and redundant descriptions thereof are omitted.

FIG. 1 is a flowchart illustrating a method of fabricating a capacitor 12, according to an embodiment of the inventive concept.

FIGS. 2A to 2J are side cross-sectional views illustrating a method of fabricating the capacitor 12, according to an embodiment of the inventive concept.

Figure 2A:
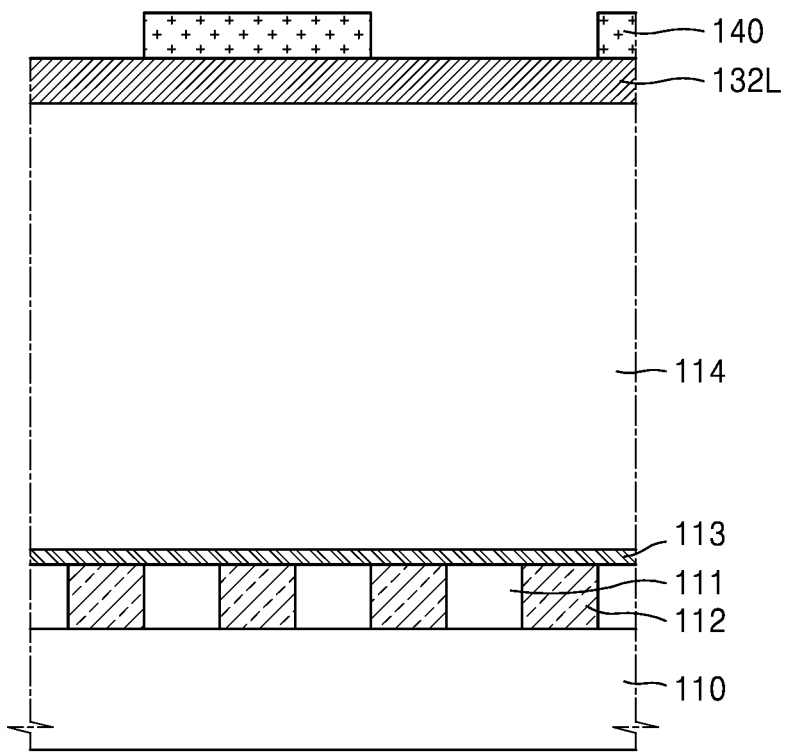
FIGS. 2A to 2J are side cross-sectional views illustrating a method of fabricating a capacitor, according to embodiments of the present inventive concept.

Referring to FIGS. 1 and 2A, lower electrodes are formed on a substrate 110 in block S10. For example, the lower electrodes may be formed in a reaction space.

In an embodiment, an interlayer insulating layer 111, contact plugs 112, and an etch stop layer 113 may be formed on the substrate 110, and a first mold layer 114 for fabricating a capacitor may be formed thereon. A support layer 132L may be formed on the first mold layer 114 (e.g., formed directly thereon in a thickness direction of the substrate 110). In some embodiments, the support layer 132L may have a thickness in a range of about 10 nm to about 500 nm. A mask pattern 140 for patterning the support layer 132L may be formed on the support layer 132L. The mask pattern 140 may be formed to have a pattern corresponding to a support pattern to be subsequently formed. In an embodiment, the mask pattern 140 may be, for example, a photoresist pattern.

In an embodiment, the substrate 110 may include a semiconductor substrate formed of a semiconductor element such as silicon (Si) or germanium (Ge), or a compound semiconductor such as silicon carbide (SiC), gallium arsenide (GaAs), indium arsenide (InAs), or indium phosphide (InP). In some embodiments, the substrate 110 may include a structure including a semiconductor substrate, at least one insulating layer formed on the semiconductor substrate, and/or at least one conductive region. The conductive region may include, for example, a well doped with an impurity, a structure doped with an impurity, a metal-containing conductive layer, and so on. In addition, the substrate 110 may have various device isolation structures such as a shallow trench isolation (STI) structure.

In an embodiment, a plurality of word lines and bit lines crossing each other may be formed on the substrate 110, and the word lines and bit lines may be covered with the interlayer insulating layer 111. Doped regions may be in the substrate 110 on both sides of each word line, and each of the contact plugs 112 may be connected to one doped region. In addition, the contact plugs 112 may each be electrically connected to a corresponding switching element. The switching element may include an active element such as a transistor or a diode.

The interlayer insulating layer 111 may include a dielectric material. For example, in an embodiment, the interlayer insulating layer 111 may be formed of an oxide, a nitride, and/or an oxynitride. The interlayer insulating layer 111 may include a single layer, or two or more layers.

The contact plugs 112 penetrating the interlayer insulating layer 111 may be formed on an active region of the substrate 110. The contact plugs 112 may be formed of at least one material selected from a group including a semiconductor material such as doped polysilicon; metal such as tungsten (W), titanium (Ti), tantalum (Ta), copper (Cu), and/or aluminum (Al); a metal nitride such as tungsten nitride (WN), titanium nitride (TiN), and/or tantalum nitride (TaN); a metal silicon nitride such as titanium silicon nitride (TiSiN) and/or tungsten silicon nitride (WSiN); and metal silicide such as tungsten silicide (WSi).

The first mold layer 114 may be formed on the etch stop layer 113. The first mold layer 114 may include at least one layer selected from an oxide layer, a nitride layer, and an oxynitride layer.

In an embodiment, a buffer layer may be further formed between the first mold layer 114 and the etch stop layer 113. The buffer layer may include at least one of an oxide layer and a nitride layer.

The support layer 132L may be formed of a material with etch selectivity to the first mold layer 114. For example, when an etch lift-off process is used to remove all or part of the first mold layer 114, the first mold layer 114 may be formed of a material with a lower etch rate than an etchant and with dielectric properties.

In an embodiment in which the first mold layer 114 is formed of at least one compound selected from $SiO_2$, SiGe, Si, and a carbon-based material, the support layer 132L may be formed of any one compound selected from SiN, SiCN, TaO, and $TiO_2$. However, embodiments of the present inventive concept are not necessarily limited to the materials above.

Figure 2B:
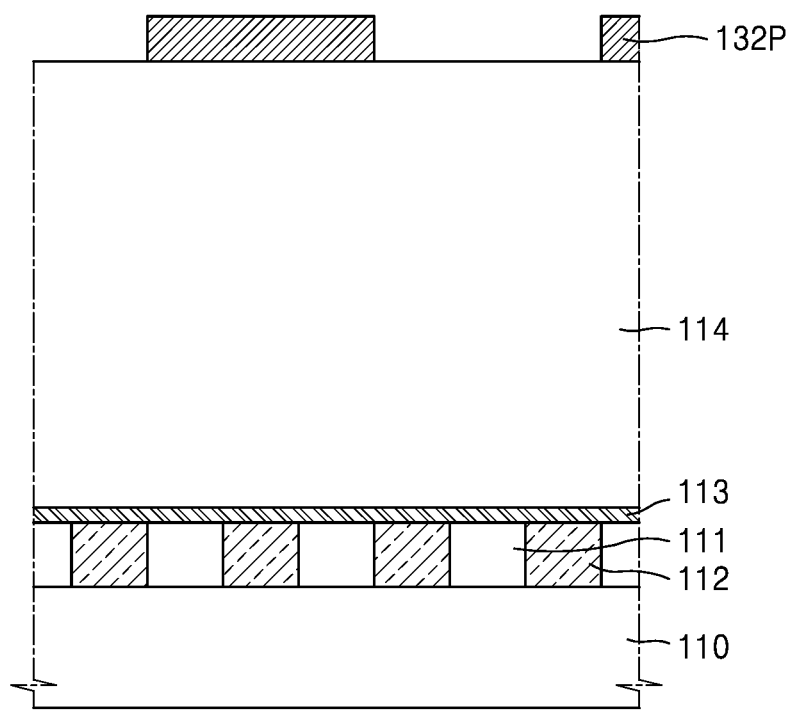

Referring to FIG. 2B, in an embodiment, a support layer pattern 132P is formed by anisotropically etching the exposed support layer 132L by using the mask pattern 140 as an etch mask. A portion of the first mold layer 114 may be exposed through the support layer pattern 132P by performing anisotropic etching.

Figure 2C:
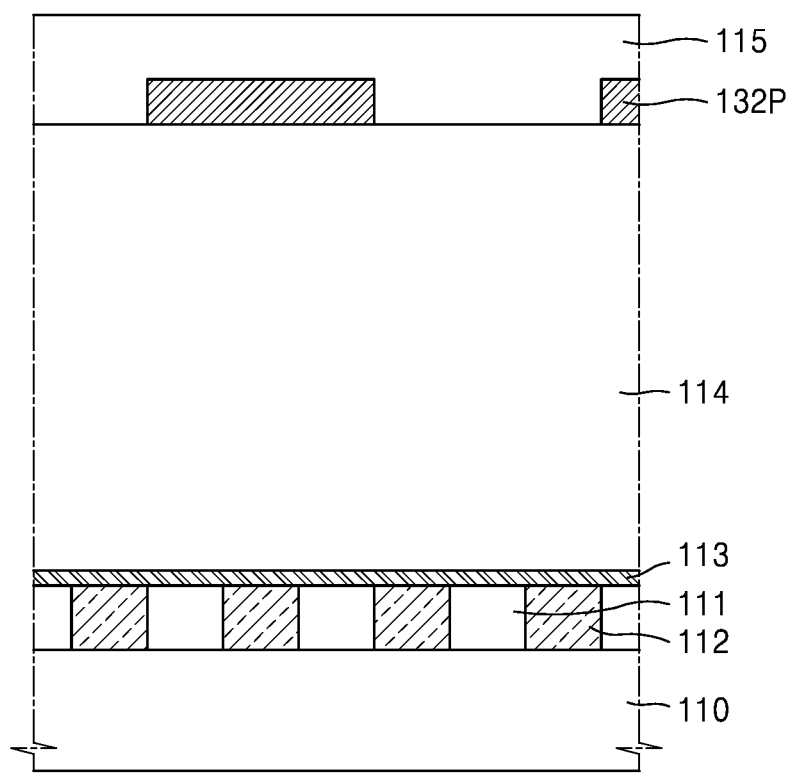

Referring to FIG. 2C, a second mold layer 115 is formed on the first mold layer 114 and the support layer pattern 132P (e.g., formed directly thereon). In an embodiment, the second mold layer 115 may be formed of the same material as the first mold layer 114 or may be formed of a material in which an etch speed of the second mold layer 115 due to an etchant is different by 10% or less from an etch speed of the first mold layer 114, such as when the first mold layer 114 and the second mold layer 115 are removed through, for example, an etch lift-off process. The second mold layer 115 may be formed to a thickness sufficient to entirely cover the support layer pattern 132P. For example, the second mold layer 115 may be formed to a thickness of at least about 50 nm. In addition, the sum of thicknesses of the first mold layer 114 and the second mold layer 115 may be in a range of about 2,000 Å to about 8,000 Å.

Figure 2D:
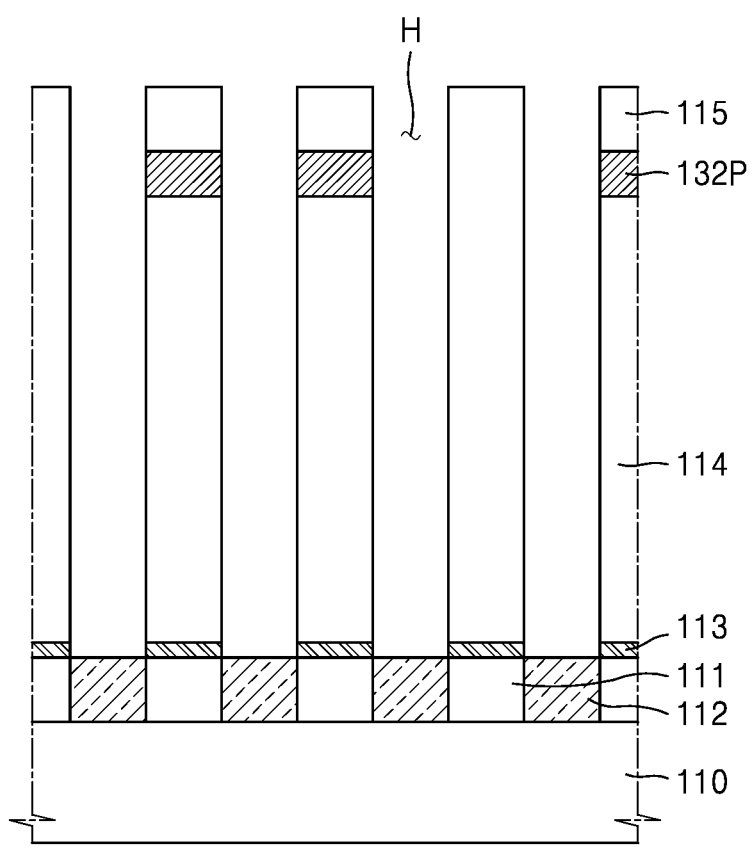

Referring to FIG. 2D, multiple openings H are formed at positions where lower electrodes are to be formed, by etching the second mold layer 115, the support layer pattern 132P, the first mold layer 114, and the etch stop layer 113 so the contact plugs 112 are exposed. In an embodiment, the openings H may each be connected to at least one other opening H by the support layer pattern 132P. However, embodiments of the present disclosure are not necessarily limited thereto and the openings H do not necessarily have to be connected thereto.

The openings H may expose upper surfaces of the contact plugs 112. The openings H may be formed by forming a mask pattern for defining the openings H on the second mold layer 115 and etching the first mold layer 114, the second mold layer 115, and the support layer pattern 132P by using the mask pattern as an etch mask. According to an embodiment, the openings H may be formed to have a hole shape.

The openings H may each have an extremely high aspect ratio, for example, in a range of about 10 to about 200.

In addition, the openings H may be formed very densely. For example, intervals between the openings H may be in a range of about 0.6 times to about 1.5 times inner diameters of the openings H.

Figure 2E:
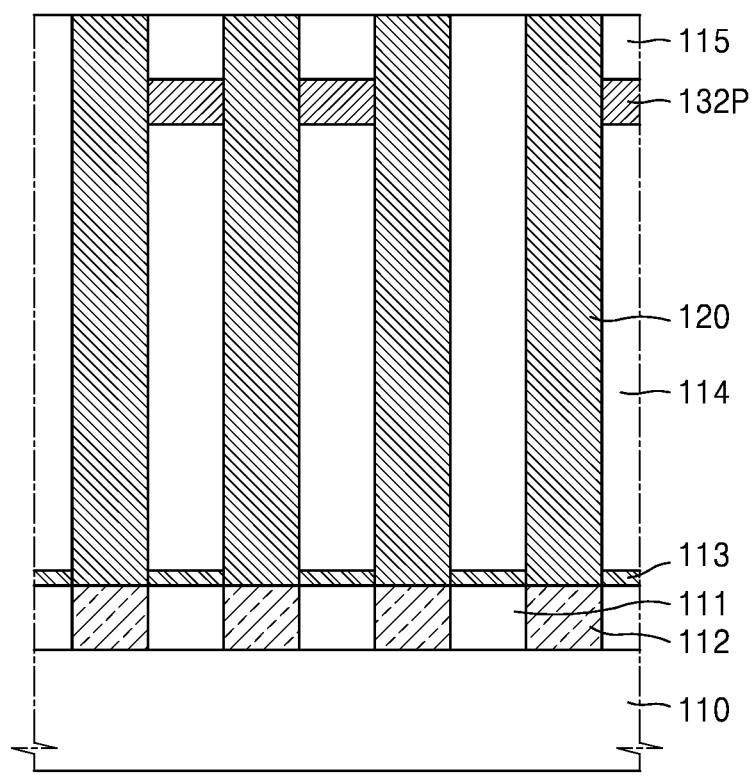

Referring to FIG. 2E, a plurality of lower electrodes 120 may be formed by depositing a conductive material on a front surface of the substrate 110. For example, the conductive material may be deposited inside the openings H and on the second mold layer 115, and then, the conductive material may be separated in the openings H. The lower electrodes 120 may be formed by filling the insides of the openings H with a conductive material. The lower electrodes 120 may be electrically connected to the contact plugs 112.

In an embodiment, the lower electrode 120 may be formed of, for example, a semiconductor material such as doped polysilicon; metal such as ruthenium (Ru), iridium (Ir), tungsten (W), molybdenum (Mo), titanium (Ti), vanadium (V), niobium (Nb), and/or tantalum (Ta); a conductive metal nitride film such as titanium nitride (TiN), vanadium nitride (VN), niobium nitride (NbN), tantalum nitride (TaN), and/or tungsten nitride (WN); a conductive metal oxide such as iridium oxide (IrO); and/or a composite thereof. The lower electrode 120 may include a single layer or may each have a structure in which two or more layers are stacked.

In an embodiment shown in FIG. 2E, the lower electrodes 120 having a pillar shape are illustrated and described. However, embodiments of the present inventive concept are not necessarily limited thereto. For example, those skilled in the art will understand that the present inventive concept is equally applicable to lower electrodes having a one-cylinder storage (OCS) shape or a concave shape.

In an embodiment, the lower electrodes 120 may be formed by chemical vapor deposition (CVD) or atomic layer deposition (ALD).

Figure 2F:
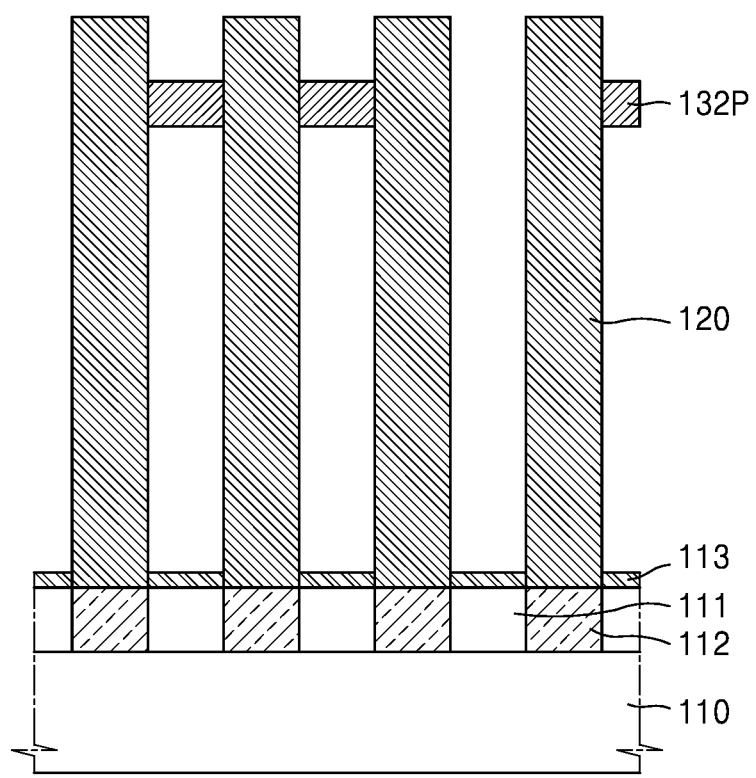

Referring to FIG. 2F, the lower electrodes 120 are formed, and then, the first mold layer 114 and the second mold layer 115 are removed. For example, in an embodiment, the first mold layer 114 and the second mold layer 115 may be removed by using an etchant including ammonium fluoride $NH_4F$, hydrofluoric acid HF, and water, or hydrofluoric acid through an etch lift-off process. Therefore, as described above, a material forming the support layer pattern 132P may be selected to have a lower etch rate than the etch rates of the first mold layer 114 and the second mold layer 115 compared to the etchant. At least some of the lower electrodes 120 may be supported by the support layer pattern 132P. In an embodiment of FIG. 2F, the support layer pattern 132P is formed at a height lower than the top of a pillar structure, such as the lower electrode 120 having a pillar shape. In some embodiments, the support layer pattern 132P may also be formed at the same height as an end of the lower electrode 120.

In some embodiments, the lower electrode 120 may be subsequently processed with plasma including nitrogen in block S20. For example, in an embodiment an oxide formed on a surface of the lower electrode 120 may be reduced to a nitride by supplying $NH_3$ plasma into a chamber in which the substrate 110 is included.

In an embodiment in which the lower electrode 120 is a conductive metal nitride film formed of, for example, titanium nitride (TiN), vanadium nitride (VN), niobium nitride (NbN), tantalum nitride (TaN), and/or tungsten nitride (WN), a natural oxide layer may be formed on a surface thereof due to exposure to the outside during handling of the substrate 110, and in this instance, the natural oxide layer may be non-uniformly formed which may cause an increase in resistance, and thus, by performing surface treatment with $NH_3$ plasma in the chamber, the natural oxide layer may be removed resulting in reduction in the resistance.

Figure 2G:
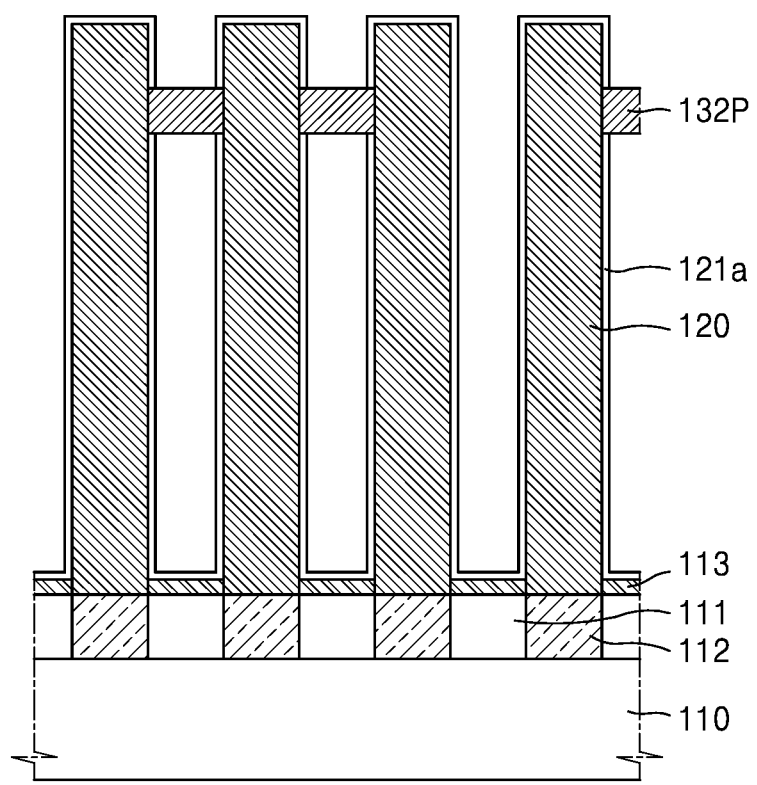

Referring to FIGS. 1 and 2G, a homogeneous oxide layer 121a may be formed on the lower electrode 120 in block S30.

The homogeneous oxide layer 121a may supply an oxidizing agent to the lower electrode 120 to form the homogeneous oxide layer 121a having a homogeneous surface on the lower electrode 120. The homogeneous oxide layer 121a may have a low surface roughness.

For example, in some embodiments, the homogeneous oxide layer 121a may have root mean square (RMS) surface roughness less than or equal to about 0.30 nm. In some embodiments, the homogeneous oxide layer 121a may have surface roughness less than or equal to about 0.29 nm, less than or equal to about 0.28 nm, less than or equal to about 0.27 nm, less than or equal to about 0.26 nm, less than or equal to about 0.25 nm. A lower limit value of the surface roughness is 0.

The homogeneous oxide layer 121a may have a thickness in a range of about 0.5 nm to about 2 nm, which is less than a thickness of a dielectric layer 122 to be described below.

In addition, the homogeneous oxide layer 121a may have a relatively low sheet resistance. In some embodiments, the homogeneous oxide layer 121a may have a sheet resistance less than or equal to about 163 ohm/sq. In some embodiments, the homogeneous oxide layer 121a may have a sheet resistance less than or equal to about 163 ohm/sq., less than or equal to about 162 ohm/sq., less than or equal to about 161 ohm/sq., less than or equal to about 160 ohm/sq., less than or equal to about 159 ohm/sq., less than or equal to about 158 ohm/sq., less than or equal to about 157 ohm/sq., less than or equal to about 156 ohm/sq., less than or equal to about 155 ohm/sq., or any range between these values. A lower limit value of the sheet resistance is 0.

After the homogeneous oxide layer 121a is formed, an overall density of the homogeneous oxide layer 121a and the lower electrode 120 may be in a range of about 5.15 $g/cm^3$ to about 5.5 $g/cm^3$. In some embodiments, the overall density may be in a range of about 5.15 $g/cm^3$ to about 5.50 $g/cm^3$, about 5.16 $g/cm^3$ to about 5.45 $g/cm^3$, about 5.17 $g/cm^3$ to about 5.40 $g/cm^3$, about 5.18 $g/cm^3$ to about 5.35 $g/cm^3$, or any range between these values.

In some embodiments, the homogeneous oxide layer 121a may be formed only on a surface of the lower electrode 120 and may not be formed on a substantial portion of the surface of the support layer pattern 132P. In an embodiment, the homogeneous oxide layer 121a may be formed by partially converting metal or a metal nitride of the lower electrode 120 into a metal oxide. Therefore, metal in the homogeneous oxide layer 121a may be the same type as the metal in the lower electrode 120.

A method of forming the homogeneous oxide layer 121a will be described in more detail below with reference to FIGS. 3 and 4.

Figure 2H:
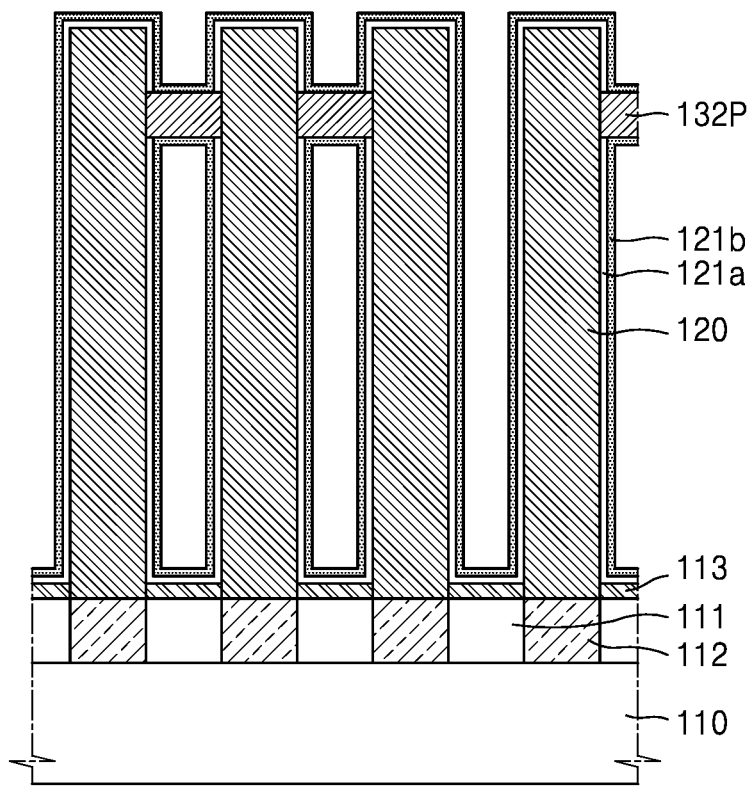

Referring to FIGS. 1 and 2H, an interface layer 121b may be formed on the homogeneous oxide layer 121a in block S40.

The interface layer 121b may also be formed through deposition or may also be formed through dopant implantation.

When the metal forming the lower electrode 120 is referred to as A, the interface layer 121b may include AON, AOx, AMoOx, ARuOx, ATaOx, ANbOx, AVOx, AZrOx, AHfOx, or a combination thereof (here, Ox indicates an oxide of metal described together).

For example, in an embodiment in which the material forming the lower electrode 120 is TiN, the interface layer 121b may include TiON, TiOx, TiMoOx, TiRuOx, TiTaOx, TiNbOx, TiVOx, TiZrOx, TiHfOx, or a combination thereof. In an embodiment in which the material forming the lower electrode 120 is WN, the interface layer 121b may include WON, WOx, WMoOx, WRuOx, WTaOx, WNbOx, WVOx, WZrOx, WHfOx, or a combination thereof. In addition, in an embodiment in which the material forming the lower electrode 120 is TaN, the interface layer 121b may include TaON, TaOx, TaMoOx, TaRuOx, TaTaOx, TaNbOx, TaVOx, TaZrOx, TaHfOx, or a combination thereof.

A thickness of the interface layer 121b may be in a range of about 0.3 nm to about 1.5 nm.

Figure 2I:
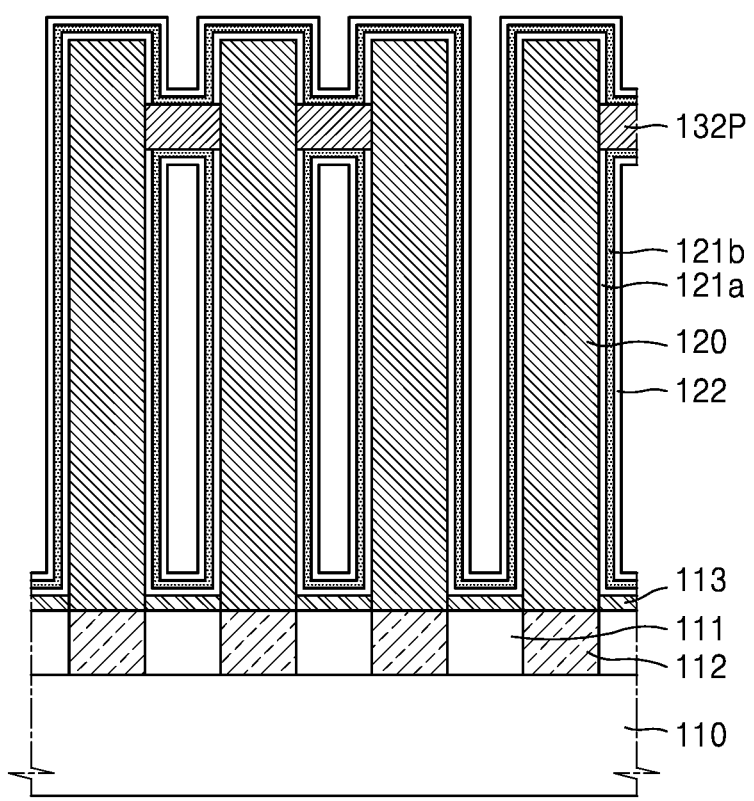

Referring to FIGS. 1 and 2I, the dielectric layer 122 is conformally formed on the interface layer 121b in block S50. The dielectric layer 122 may include, for example, a metal oxide and/or a metalloid oxide. In an embodiment, the dielectric layer 122 may include, for example, silicon oxide, hafnium oxide, tantalum oxide, titanium oxide, zirconium oxide, aluminum oxide, $SrTiO_3$, (Ba, Sr)$TiO_3$, or the like. However, embodiments of the present inventive concept are not necessarily limited thereto.

The formation of the dielectric layer 122 may be temporally separated from the formation of the homogeneous oxide layer 121a by the formation of the interface layer 121b. A method of forming the dielectric layer 122 is described in detail below with reference to FIG. 5.

Figure 2J:
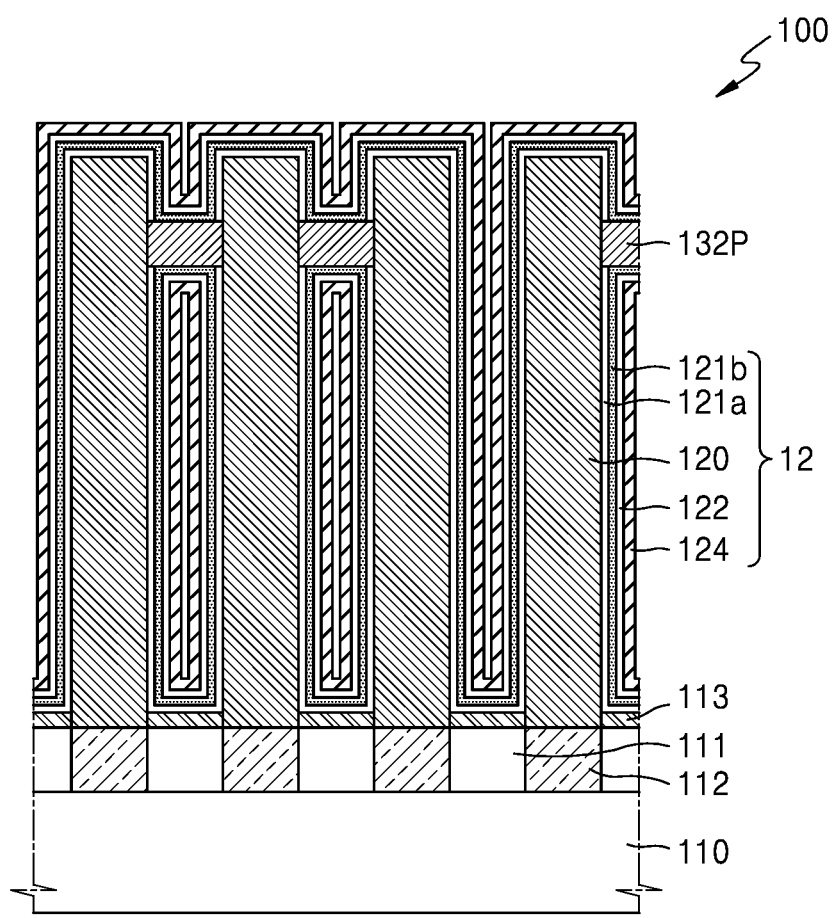

Referring to FIGS. 1 and 2J, the capacitor 12 may be completely fabricated by forming an upper electrode 124 on the dielectric layer 122 in block S60. In an embodiment, the upper electrode 124 may be formed of, for example, a semiconductor material such as doped polysilicon; metal such as ruthenium (Ru), iridium (Ir), tungsten (W), molybdenum (Mo), titanium (Ti), vanadium (V), niobium (Nb), or tantalum (Ta); a conductive metal nitride film such as titanium nitride (TiN), vanadium nitride (VN), niobium nitride (NbN), tantalum nitride (TaN), or tungsten nitride (WN); a conductive metal oxide such as iridium oxide (IrO); and/or a composite thereof. The upper electrode 124 may also include a single layer or may also have a structure in which two or more layers are stacked.

A material of the upper electrode 124 may be the same as or different from the material of the lower electrode 120.

In some embodiments, the upper electrode 124 may be conformally formed on a surface of the dielectric layer 122 to have a substantially constant thickness. In some embodiments, a ratio of a thickness of the thinnest portion of the upper electrode 124 to a thickness of the thickest portion thereof may be in a range of about 0.80 to about 1.0. In some embodiments, the ratio may be in a range of about 0.850 to about 0.999, about 0.900 to about 0.999, about 0.950 to about 0.999, or any range between these values.

An embodiment of FIG. 2J illustrates that the upper electrode 124 extends substantially and conformally along a surface of the dielectric layer 122. However, embodiments of the present inventive concept are not necessarily limited thereto. For example, in another embodiment, the upper electrode 124 is not necessarily formed in this shape. In some embodiments, the upper electrode 124 may have a relatively flat upper surface and may fill a space between two dielectric layers 122 adjacently facing each other.

The capacitor 12 may be combined with the switching element described with reference to FIG. 2A to constitute one semiconductor device 100.

Figure 3:
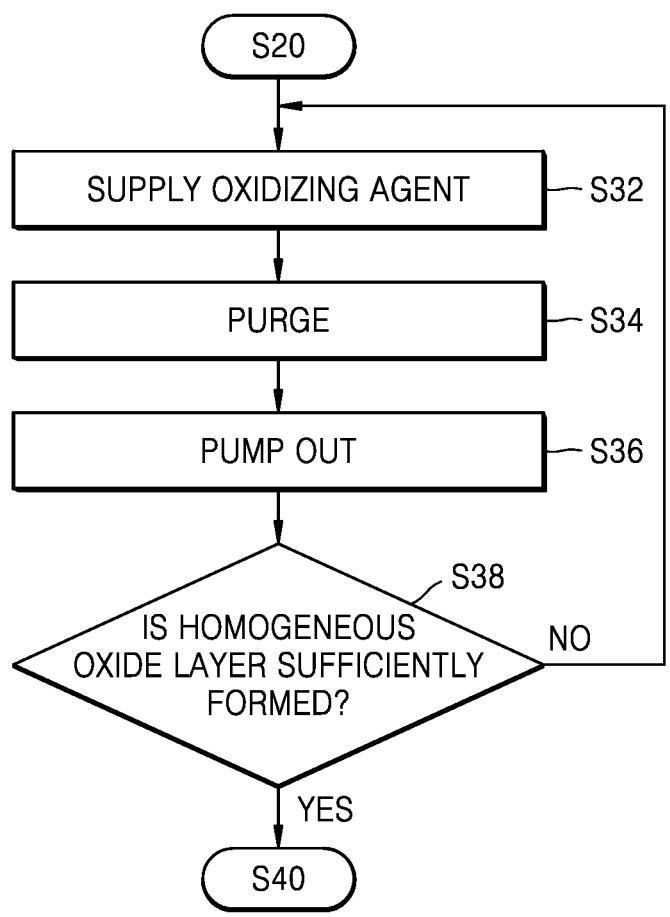
FIG. 3 is a flowchart illustrating a method of forming a homogeneous oxide layer according to an embodiment of the present inventive concept.

FIG. 3 is a flowchart illustrating a method of forming the homogeneous oxide layer 121a. FIG. 4 is a timing diagram illustrating a change in pressure in a reaction space with time when the homogeneous oxide layer 121a is formed.

Figure 4:
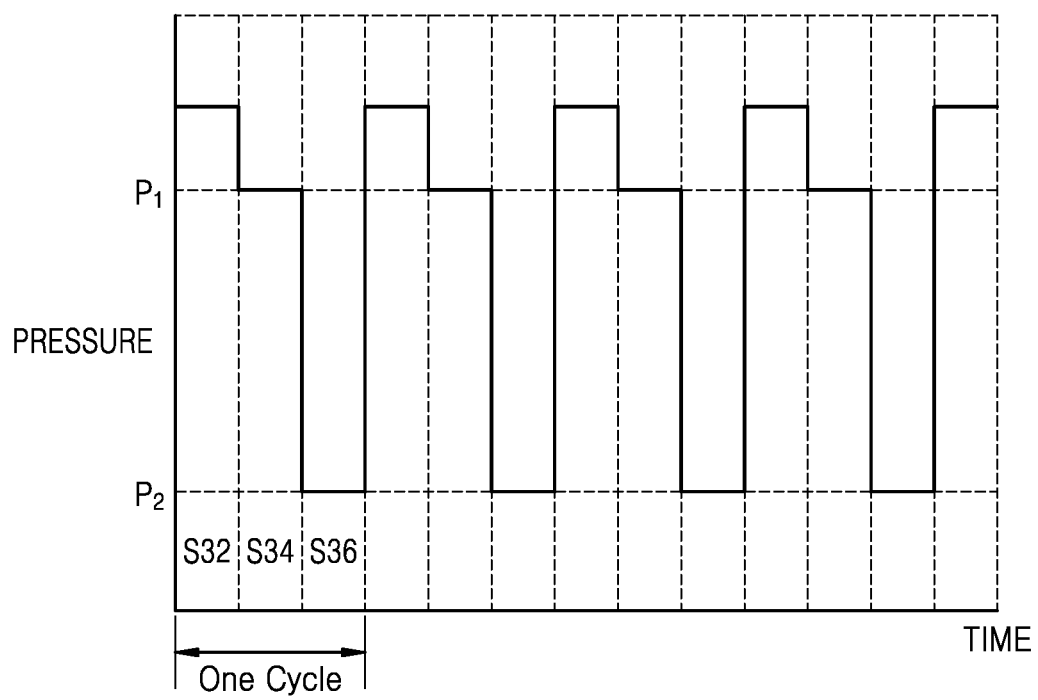
FIG. 4 is a timing diagram illustrating a change in pressure in a reaction space with time when a homogeneous oxide layer is formed according to an embodiment of the present inventive concept.

Referring to FIGS. 3 and 4, an oxidizing agent may be supplied on the lower electrode 120 to form the homogeneous oxide layer 121a in block S32.

In an embodiment, the oxidizing agent may include, for example, $O_2$, $O_3$, $H_2O$, $H_2O_2$, $CH_3OH$, $C_2H_5OH$, or a mixture thereof. However, embodiments of the present inventive concept are not necessarily limited thereto. In some embodiments, the oxidizing agent may be supplied in a range of about 1 second to about 5 minutes. In some embodiments, the supply time of the oxidizing agent may be in a range of about 2 seconds to about 300 seconds, about 5 seconds to about 280 seconds, about 10 seconds to about 250 seconds, about 20 seconds to about 230 seconds, about 30 seconds to about 200 seconds, about 50 seconds to about 180 seconds, about 60 seconds to about 150 seconds, or any range between these values.

When the supply time of the oxidizing agent is too long, the homogeneous oxide layer 121a may not be uniformly formed on the lower electrodes 120. When the supply time of the oxidizing agent is too short, a formation rate of the homogeneous oxide layer 121a is too slow, and thus, throughput of production may be insufficient.

In some embodiments, a supply flow rate of the oxidizing agent may be in a range of about 10,000 sccm to about 30,000 sccm. In some embodiments, the supply flow rate of the oxidizing agent may be in a range of about 10,000 sccm to about 30,000 sccm, about 11,000 sccm to about 29,000 sccm, about 12,000 sccm to about 28,000 sccm, about 13,000 sccm to about 27,000 sccm, about 14,000 sccm to about 26,000 sccm, about 15,000 sccm to about 25,000 sccm, about 16,000 sccm to about 24,000 sccm, or any range between these values.

When the supply flow rate of the oxidizing agent is too high, the homogeneous oxide layer 121a may not be uniformly formed on the lower electrodes 120. When the supply flow rate of the oxidizing agent is too slow, a formation rate of the homogeneous oxide layer 121a is too slow, and thus, throughput may be insufficient.

Thereafter, the oxidizing agent may be purged in block S34. In an embodiment, the purging may be performed by supplying an inert gas such as helium (He), neon (Ne), or argon (Ar), and/or a low-active gas such as nitrogen ($N_2$) to the periphery of the lower electrode 120.

In some embodiments, the purging may be performed in a range of about 1 second to about 5 minutes. In some embodiments, the purging time may be in a range of about 2 seconds to about 300 seconds, about 5 seconds to about 280 seconds, about 10 seconds to about 250 seconds, about 20 seconds to about 230 seconds, about 30 seconds to about 200 seconds, about 50 seconds to about 180 seconds, about 60 seconds to about 150 seconds, or any range between these values.

When the purging time is too short, the homogeneous oxide layer 121a may not be uniformly formed on the lower electrodes 120. When the purging time is too long, a formation rate of the homogeneous oxide layer 121a is too slow, and thus, throughput of production may be insufficient.

In some embodiments, an operation of purging an oxidizing agent may be performed such that a purge pressure $P_1$ of a reaction space in which the substrate 110 is placed is in a range of about 30 Pa to about 200 Pa. The purge pressure $P_1$ may be an internal pressure of the reaction space after the purge is performed. In some embodiments, the purge pressure $P_1$ may be in a range of about 30 Pa to about 200 Pa, about 35 Pa to about 180 Pa, about 40 Pa to about 160 Pa, about 45 Pa to about 140 Pa, about 50 Pa to about 120 Pa, about 55 Pa to about 100 Pa, about 60 Pa to about 80 Pa, or any range between these values.

In the operation of purging the oxidizing agent, when the purge pressure $P_1$ is too high, the oxidizing agent may not be sufficiently removed. In contrast to this, when the purge pressure $P_1$ is too low, an effect of the purging is sufficient, which may be economically disadvantageous.

Thereafter, the pressure may be reduced through pumping-out gases in the reaction space such that the periphery of the lower electrode has a pumping-out pressure $P_2$ in a range of about 1 Pa to about 30 Pa. The pumping-out pressure $P_2$ may be an internal pressure of the reaction space after the pumping-out of gases is performed. The pumping-out pressure $P_2$ is significantly lower than the purge pressure $P_1$. In some embodiments, the pumping-out pressure $P_2$ may be in a range of about 5% to about 30%, about 7% to about 28%, about 9% to about 26%, about 10% to about 25%, about 12% to about 23%, or about 15% to about 20% of the purge pressure $P_1$, or any range between these values.

In some embodiments, the pumping-out pressure $P_2$ may be in a range of about 1 Pa to about 30 Pa. In some embodiments, the pumping-out pressure $P_2$ may be in a range of about 1 Pa to about 30 Pa, about 2 Pa to about 29 Pa, about 3 Pa to about 28 Pa, about 4 Pa to about 27 Pa, about 5 Pa to about 25 Pa, about 6 Pa to about 24 Pa, about 7 Pa to about 23 Pa, about 8 Pa to about 22 Pa, about 9 Pa to about 21 Pa, about 10 Pa to about 20 Pa, or any range between these values.

When the pumping-out pressure $P_2$ is too high, the homogeneous oxide layer 121a may not be uniformly formed on the lower electrodes 120. When the pumping-out pressure $P_2$ is too low, pumping-out takes a long time, and thus, a formation rate of the homogeneous oxide layer 121a is too slow, and throughput of production may be insufficient.

In some embodiments, the pumping-out may be performed in a range of about 1 second to about 5 minutes. In some embodiments, a pumping-out time may be in a range of about 2 seconds to about 300 seconds, about 5 seconds to about 280 seconds, about 10 seconds to about 250 seconds, about 20 seconds to about 230 seconds, about 30 seconds to about 200 seconds, about 50 seconds to about 180 seconds, about 60 seconds to about 150 seconds, or any range between these values.

When the pumping-out time is too short, the homogeneous oxide layer 121a may not be uniformly formed on the lower electrodes 120. When the pumping-out time is too long, a formation rate of the homogeneous oxide layer 121a is too slow, and thus, throughput of production may be insufficient.

Operation in block S32 of supplying the oxidizing agent, operation in block S34 of purging the oxidizing agent, and operation in block S36 of performing pumping-out to reduce a pressure around the lower electrode may form one homogeneous oxide layer forming cycle. The homogeneous oxide layer forming cycle may be performed once or more times by determining whether the homogeneous oxide layer 121a is sufficiently formed.

For example, the homogeneous oxide layer forming cycle may be repeated about 2 to about 50 times. In some embodiments, the homogeneous oxide layer forming cycle may be performed about 2 to about 50 cycles, about 3 times to about 48 times, about 5 times to about 45 times, about 7 times to about 42 times, about 10 times to about 40 times, about 12 times to about 38 times, about 13 times to about 35 times, about 15 times to about 32 times, about 17 times to about 30 times, about 20 times to about 28 times, or any times between these values.

The homogeneous oxide layer forming cycle may be performed at a temperature in a range of about 100° C. to about 300° C. When the temperature at which the homogeneous oxide layer forming cycle is performed is too high, the homogeneous oxide layer 121a may not be uniformly formed on the lower electrodes 120. When the temperature at which the homogeneous oxide layer forming cycle is performed is too low, a formation rate of the homogeneous oxide layer 121a is too slow, and thus, throughput of production may be insufficient.

In some embodiments, operation in block S32 of supplying an oxidizing agent when the homogeneous oxide layer forming cycle is performed, operation in block S34 of purging the oxidizing agent, and operation in block S36 of performing pumping-out to reduce a pressure around the lower electrode may be sequentially performed.

As described above, the homogeneous oxide layer 121a may be obtained by repeatedly performing the homogeneous oxide layer forming cycle. Sine the homogeneous oxide layer 121a is uniformly formed with small roughness compared to an oxide layer formed by known technology, a sheet resistance is small and device reliability is increased. Since the homogeneous oxide layer 121a is uniformly formed with small roughness, there are few peak points at which an electric field is locally concentrated, and as a result, read and/or write errors due to a leakage current may be reduced, thereby increasing device reliability.

Furthermore, stress applied to the lower electrodes 120 by the homogeneous oxide layer 121a is low or the stress is applied more symmetrically, and thus, 2-bit type defects due to capacitor collapse may be reduced.

Figure 5:
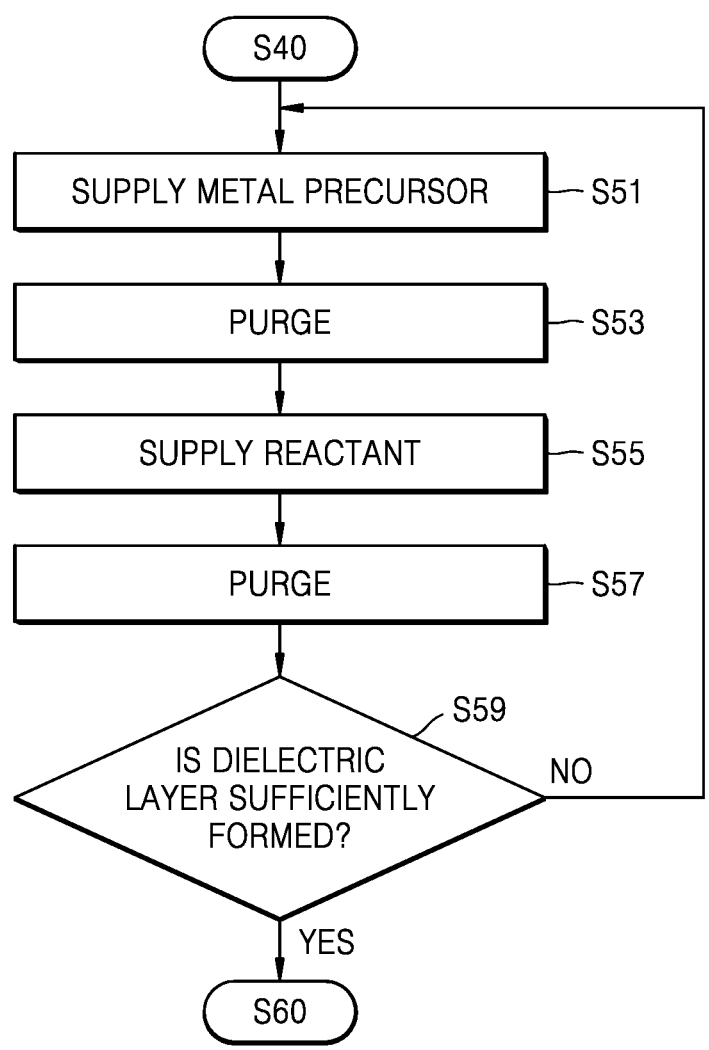
FIG. 5 is a flowchart illustrating a process of forming a dielectric layer according to an embodiment of the present inventive concept.

FIG. 5 is a flowchart illustrating a process of forming the dielectric layer 122, and the dielectric layer 122 may be formed by an atomic layer deposition process.

Referring to FIG. 5, a metal precursor may be provided on the interface layer 121b to form the dielectric layer 122 on the interface layer 121b (S51).

In an embodiment, the dielectric layer 122 may include an oxide of silicon and/or metal, and the metal precursor may be a metal organic compound of the metal.

For example, in an embodiment in which the metal is hafnium, the metal precursor may include at least one compound selected from hafnium tertiary butoxide (Hf (O$^t$Bu)$_4$, HTB), tetrakis(diethylamido)hafnium (Hf(NEt$_2$)$_4$, TDEAH), tetrakis(ethylmethylamido)hafnium (Hf(NEtMe)$_4$, TEMAH), and tetrakis(dimethylamido)hafnium (Hf (NMe$_2$)$_4$, TDMAH). However, embodiments of the present inventive concept are not necessarily limited thereto. Here, Me represents a methyl group, Et represents an ethyl group, and Bu represents a butyl group.

Thereafter, excess metal precursor may be purged and removed to form a monolayer of the metal precursor on the interface layer 121b in block S53.

In an embodiment, the purging may be performed by supplying an inert gas such as helium (He), neon (Ne), or argon (Ar), and/or a low-active gas such as nitrogen (N$_2$) on the interface layer 121b.

The dielectric layer 122 may then be formed by supplying a reactant on the monolayer of the metal precursor in block S55. The supplied reactant reacts with the metal precursor to form the dielectric layer 122.

The reactant may be at least one compound selected from the group including, for example, H$_2$O, O$_2$, O$_3$, N$_2$O, NO, NO$_2$, N$_2$O$_4$, H$_2$O$_2$, alcohol having carbon number of 1 to 10, ether having carbon number of 2 to 10, ketone having carbon number of 3 to 10, carboxylic acid having carbon number of 1 to 10, and ester having carbon number of 1 to 10.

Thereafter, a purge gas may be supplied on the interface layer 121b to remove excess reactant and a possible reaction by-product in block S57. In an embodiment, the purging may be performed by supplying an inert gas such as helium (He), neon (Ne), or argon (Ar), and/or a low-active gas such as nitrogen (N$_2$) on the interface layer 121b.

Operation in block S51 of providing a metal precursor on the interface layer 121b described above, operation in block S53 of purging the metal precursor, operation in block S55 of providing a reactant on the adsorbed metal precursor, and operation in block S57 of purging the reactant may form one deposition cycle.

Thereafter, it is determined whether the dielectric layer 122 is formed to a sufficient thickness, and when a thickness of the dielectric layer 122 is yet insufficient, the deposition cycle may be further performed in block S59. In some embodiments, the deposition cycle may be performed two or more times until the dielectric layer 122 is formed to a sufficient thickness.

Hereinafter, configurations and effects of the present inventive concept are described in more detail with reference to specific examples and comparative examples. However, the examples are only for clearer understanding of the present inventive concept and are not intended to limit the scope of the present inventive concept.

EXAMPLE 1

Ozone ($O_3$) was supplied onto a TiN lower electrode as an oxidizing agent for 20 seconds at a flow rate of 15,000 sccm, purged with $N_2$ for 10 seconds, and then pumped out to a pressure of 10 Pa for 15 seconds, thereby forming a homogeneous oxide layer forming cycle. The homogeneous oxide layer forming cycle was performed 10 times and a homogeneous oxide layer was formed.

After a TiON layer was formed as an interface layer on the homogeneous oxide layer, an Hf oxide dielectric layer was formed on the interface layer, and a TiN upper electrode was formed thereon, and thus, capacitors were fabricated.

COMPARATIVE EXAMPLE 1

Capacitors were fabricated in the same manner as in Example 1, except that a preliminary oxide layer was formed by supplying ozone ($O_3$) at a flow rate of 15,000 sccm for 5 minutes instead of repeatedly performing a homogeneous oxide layer forming cycle on the TiN lower electrode as in Example 1.

As a result of counting 2-bit type defects of the capacitors fabricated by the methods of Example 1 and Comparative Example 1, 60 capacitors were defective among the capacitors fabricated by the method of Example 1, and 135 capacitors were defective among the capacitors fabricated by the method of Comparative Example 1. Accordingly, when the homogeneous oxide layer forming cycle of the present inventive concept is performed instead of the known method of forming a preliminary oxide layer, 2-bit type defects may be reduced to half or less. This means that defects caused by a tilting capacitor in contact with an adjacent capacitor during the fabrication process are reduced.

In addition, as a result of measurement, an average capacitance of the capacitor of Example 1 was about 9.13 fF, and an average capacitance of the capacitor of Comparative Example 1 was about 9.08 fF. Accordingly, the capacitance thereof also increases when capacitors are fabricated by performing a homogeneous oxide layer forming cycle of an embodiment of the present inventive concept.

In addition, the capacitors fabricated by the methods of Example 1 and Comparative Example 1 were tested for data write errors. 120 data write errors were detected for the capacitors fabricated by the method of Example 1, whereas 148 data write errors were detected for the capacitors fabricated by the method of Comparative Example 1. Therefore, the device reliability of the capacitor may be significantly increased by performing the homogeneous oxide layer forming cycle of an embodiment of the present inventive concept instead of the known method of forming a preliminary oxide layer.

In addition, the overall density of the lower electrode and the homogeneous oxide layer of Example 1 was measured to be 5.18 g/cm$^3$, and the overall density of the lower electrode and the preliminary oxide layer of Comparative Example 1 was measured to be 5.09 g/cm$^3$. Therefore, it may be estimated that the homogeneous oxide layer of an embodiment of the present inventive concept is densely formed with a significantly higher density.

Figure 6:
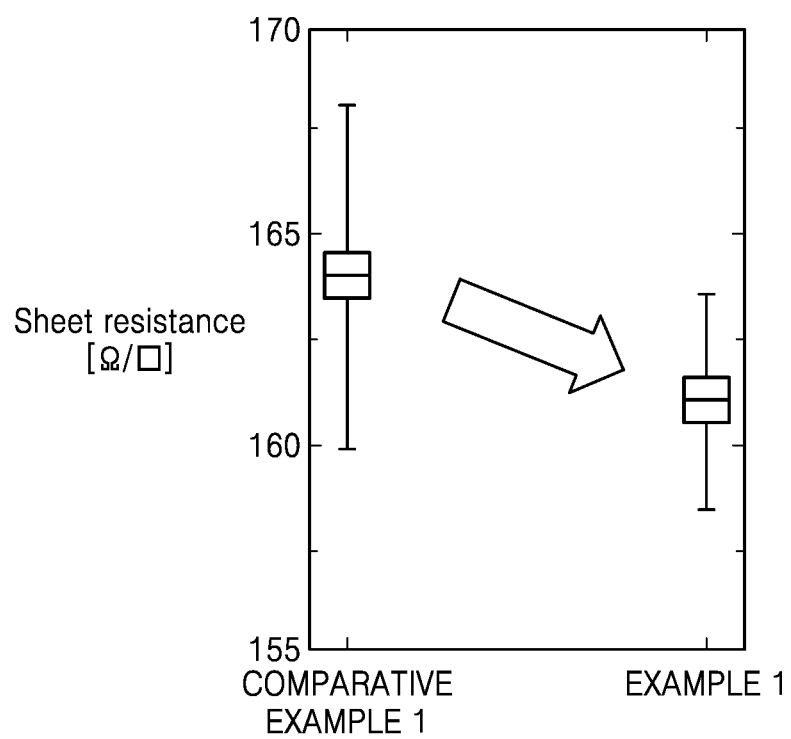
FIG. 6 is a graph illustrating results of measuring a sheet resistance of a surface of a homogeneous oxide layer formed by a method of Example 1 and a sheet resistance of a surface of a preliminary oxide layer formed by a method of Comparative Example 1.

FIG. 6 is a graph illustrating results of measuring a sheet resistance of a surface of a homogeneous oxide layer formed by a method of Example 1 and a sheet resistance of a surface of a preliminary oxide layer formed by a method of Comparative Example 1.

Referring to FIG. 6, a sheet resistance of the homogeneous oxide layer formed by the method of Example 1 is reduced when compared to the preliminary oxide layer formed by the method of Comparative Example 1. It is presumed that this is because the preliminary oxide layer of Comparative Example 1 is non-uniformly formed, and thus, the oxide locally penetrates deeper.

Figure 7:
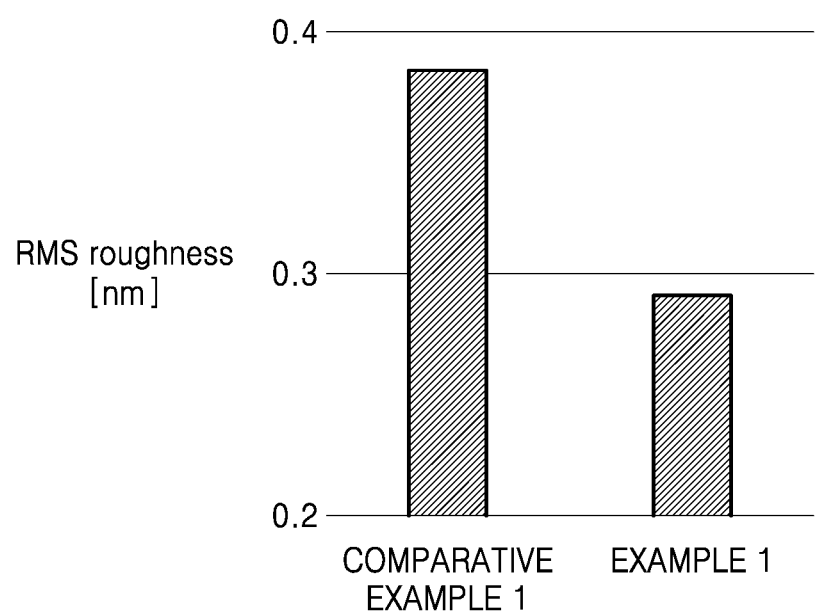
FIG. 7 is a graph illustrating results of measuring RMS surface roughness of a surface of a homogeneous oxide layer formed by a method of Example 1 and RMS surface roughness of a surface of a preliminary oxide layer formed by a method of Comparative Example 1.

FIG. 7 is a graph illustrating results of measuring RMS surface roughness of a surface of a homogeneous oxide layer formed by a method of Example 1 and RMS surface roughness of a surface of a preliminary oxide layer formed by a method of Comparative Example 1.

Referring to FIG. 7, the RMS surface roughness of the homogeneous oxide layer formed by the method of Example 1 is increased compared to the preliminary oxide layer formed by the method of Comparative Example 1.

A relatively large surface roughness results in a localized electric field, which increases the possibility of leakage currents, thereby increasing the possibility of read and write errors. Therefore, the capacitor of Example 1 with a smaller RMS surface roughness has higher reliability and enables data read and write more stable. The fact that the homogeneous oxide layer formed by the method of Example 1 has fewer data write errors compared to the preliminary oxide layer formed by the method of Comparative Example 1 is presumed to be due to the relatively smaller RMS surface roughness.

While the present inventive concept has been particularly shown and described with reference to embodiments thereof, it will be understood that various changes in form and details may be made therein without departing from the spirit and scope of the present inventive concept.

What is claimed is:

1. A method of fabricating a capacitor, the method comprising:
    forming a lower electrode on a semiconductor substrate in a reaction space;
    forming a homogeneous oxide layer on the lower electrode;
    forming a dielectric layer on the homogeneous oxide layer; and
    forming an upper electrode on the dielectric layer;
    wherein
    the forming of the homogeneous oxide layer includes performing a homogeneous oxide layer forming cycle at least one time, the homogeneous oxide layer forming cycle comprising:
    supplying an oxidizing agent,
    purging the oxidizing agent, and
    pumping-out the reaction space,
    wherein a pumping-out pressure is lower than a purge pressure in a range of approximately 5% to approximately 30% of the purge pressure.

2. The method of claim 1, wherein the homogeneous oxide layer forming cycle includes sequentially performing the supplying of the oxidizing agent, the purging of the oxidizing agent, and the pumping-out of the reaction space.

3. The method of claim 1, wherein the oxidizing agent includes $O_2$, $O_3$, $H_2O$, $H_2O_2$, $CH_3OH$, $C_2H_5OH$, or a mixture thereof.

4. The method of claim 1, wherein the pumping-out the reaction space is performed such that an internal pressure of the reaction space after the pumping-out is performed is in a range of about 1 Pa to about 30 Pa.

5. The method of claim 4, wherein the pumping-out the reaction space is performed in a range of about 1 second to about 5 minutes.

6. The method of claim 1, wherein the purging of the oxidizing agent is performed so that an internal pressure of the reaction space is in a range of about 30 Pa to about 200 Pa after the purging is performed.

7. The method of claim 6, wherein the purging of the oxidizing agent is performed in a range of about 1 second to about 5 minutes.

8. The method of claim 1, wherein, in the supplying of the oxidizing agent, the oxidizing agent is supplied at a flow rate in a range of about 10,000 sccm to about 30,000 sccm.

9. The method of claim 8, wherein the supplying of the oxidizing agent is performed in a range of about 1 second to about 5 minutes.

10. The method of claim 1, further comprising:
forming an interface layer on the homogeneous oxide layer before the forming of the dielectric layer on the homogeneous oxide layer and before the forming of the upper electrode on the dielectric layer.

11. The method of claim 10, wherein:
the lower electrode includes a conductive metal nitride including a nitride of a metal A; and
the interface layer includes AON, AOx, AMoOx, ARuOx, ATaOx, ANbOx, AVOx, AZrOx, AHfOx, or a combination thereof, in which Ox refers to an oxide of metal.

12. The method of claim 11, wherein the metal A includes titanium (Ti), tantalum (Ta), or tungsten (W).

13. The method of claim 1, further comprising:
performing plasma treatment on the lower electrode before the forming of the homogeneous oxide layer on the lower electrode.

14. The method of claim 1, wherein the homogeneous oxide layer forming cycle is performed in a range of about 2 to about 50 times.

15. A method of fabricating a semiconductor device, the method comprising:
forming a lower electrode on a semiconductor substrate in a reaction space;
performing a homogeneous oxide layer forming cycle at least two times to form a homogeneous oxide layer on the lower electrode;
forming an interface layer on the homogeneous oxide layer after the performing of the homogeneous oxide layer forming cycle at least two times;
forming a dielectric layer on the interface layer; and
forming an upper electrode on the dielectric layer;
wherein
the homogeneous oxide layer forming cycle comprises sequentially performing:
supplying an oxidizing agent;
purging the oxidizing agent; and
pumping-out the reaction space, wherein a pumping-out pressure is lower than a purge pressure in a range of approximately 5% to approximately 30% of the purge pressure,
and
wherein the forming of the dielectric layer on the interface layer includes performing a deposition cycle at least two times, the deposition cycle comprising:
providing a metal precursor on the interface layer;
purging the excess metal precursor;
supplying a reactant to form the dielectric layer; and
purging excess reactant.

16. The method of claim 15, wherein surface roughness of a root mean square (RMS) of the homogeneous oxide layer is less than or equal to about 0.3 nm.

17. The method of claim 15, wherein a sheet resistance of the homogeneous oxide layer is less than or equal to about 162 ohms/sq.

18. The method of claim 15, wherein the homogeneous oxide layer forming cycle is performed at a temperature in a range of about 100° C. to about 300° C.

19. The method of claim 15, wherein an overall density of the homogeneous oxide layer and the lower electrode is in a range of about 5.15 g/cm$^3$ to about 5.5 g/cm$^3$.

20. A method of fabricating a semiconductor device, the method comprising:
forming a conductive lower electrode on a semiconductor substrate, the conductive lower electrode including a nitride of a metal A;
forming a homogeneous oxide layer on the lower electrode;
forming a dielectric layer on the homogeneous oxide layer; and
forming an upper electrode on the dielectric layer,
wherein
the forming of the homogeneous oxide layer includes performing a homogeneous oxide layer forming cycle at least one time, the homogeneous oxide layer forming cycle comprises sequentially performing:
partially converting the nitride of the metal A into an oxide of the metal A by supplying an oxidizing agent;
purging the oxidizing agent; and
reducing a pressure around the lower electrode to about 1 Pa to about 30 Pa.

* * * * *